US012713886B2

(12) United States Patent
Choi et al.

(10) Patent No.: US 12,713,886 B2
(45) Date of Patent: Aug. 18, 2026

(54) SEMICONDUCTOR DEVICES AND METHOD OF MANUFACTURING THE SAME

(71) Applicant: Samsung Electronics Co., Ltd., Suwon-si (KR)

(72) Inventors: Kyuhoon Choi, Suwon-si (KR); Seungseok Ha, Suwon-si (KR); Seokmyeong Kang, Suwon-si (KR); Seowoo Nam, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 421 days.

(21) Appl. No.: 18/456,561

(22) Filed: Aug. 28, 2023

(65) Prior Publication Data

US 2024/0153815 A1 May 9, 2024

(30) Foreign Application Priority Data

Nov. 9, 2022 (KR) ........................ 10-2022-0149019

(51) Int. Cl.
*H10W 20/00* (2026.01)
*H10P 50/00* (2026.01)
(Continued)

(52) U.S. Cl.
CPC ........... *H10W 20/092* (2026.01); *H10P 50/73* (2026.01); *H10P 52/403* (2026.01);
(Continued)

(58) Field of Classification Search
CPC .... H10P 95/062; H10P 95/064; H10P 95/068; H10W 20/092; H10W 20/098; H10W 20/063; H10W 20/0633; H10W 20/0636
See application file for complete search history.

(56) References Cited

U.S. PATENT DOCUMENTS 6,432,843 B1 * 8/2002 Kim .................... H10W 20/097 438/626
6,479,399 B2 * 11/2002 Park ........................ H10P 50/73 438/738
(Continued)

FOREIGN PATENT DOCUMENTS

KR 10-1998-0012082 A 4/1998
KR 20050059914 A * 6/2005 .......... H10W 20/056
(Continued)

*Primary Examiner* — David A Zarneke
(74) *Attorney, Agent, or Firm* — Wolf, Greenfield & Sacks, P.C.

(57) ABSTRACT

A method of manufacturing a semiconductor device includes forming conductive patterns on which stopper layers are formed, respectively, on a substrate including a first region having a first pattern density and a second region having a second pattern density lower than the first pattern density, forming a first interlayer insulating layer on the conductive patterns, exposing at least a portion of the first interlayer insulating layer on the first region and forming a photoresist pattern on the second region, etching at least a portion of the first interlayer insulating layer on the first region, performing first polishing to expose upper surfaces of ones of the stopper layers on the first region, etching the ones of the stopper layers on the first region, forming a second interlayer insulating layer on the conductive patterns, and performing second polishing to expose upper surfaces of ones of the conductive patterns on the first region.

20 Claims, 6 Drawing Sheets

(51) Int. Cl.
*H10P 52/40* (2026.01)
*H10P 95/00* (2026.01)

(52) U.S. Cl.
CPC .......... *H10P 95/062* (2026.01); *H10P 95/064* (2026.01); *H10W 20/063* (2026.01); *H10W 20/0633* (2026.01); *H10W 20/0636* (2026.01); *H10W 20/098* (2026.01)

(56) References Cited

U.S. PATENT DOCUMENTS

| | | | | |
|---|---|---|---|---|
| 6,723,644 | B2 | 4/2004 | Kim et al. | |
| 2002/0063334 | A1* | 5/2002 | Shin | H10P 14/6686 257/E21.279 |
| 2003/0181142 | A1 | 9/2003 | Thesauro et al. | |

FOREIGN PATENT DOCUMENTS

| | | | | |
|---|---|---|---|---|
| KR | 20050064591 | A * | 6/2005 | H10W 20/062 |
| KR | 101212060 | B1 * | 12/2012 | H10P 50/667 |

* cited by examiner

SEMICONDUCTOR DEVICES AND METHOD OF MANUFACTURING THE SAME

CROSS-REFERENCE TO RELATED APPLICATION(S)

This application claims priority under 35 U.S.C. § 119 to Korean Patent Application No. 10-2022-0149019 filed on Nov. 9, 2022 in the Korean Intellectual Property Office, the entire disclosure of which is incorporated herein by reference.

BACKGROUND

The present disclosure relates to a semiconductor device and a method of manufacturing the same.

A semiconductor device may include semiconductor elements formed on a semiconductor substrate, wirings for connecting the semiconductor elements, and the like. As the degree of integration of semiconductor devices increases, research into reducing the area of wires for connecting semiconductor devices and arranging the wires efficiently has been actively conducted.

SUMMARY

Example embodiments provide a semiconductor device having improved integration and/or electrical characteristics, and a method of manufacturing the same.

According to example embodiments, a method of manufacturing a semiconductor device includes forming a plurality of conductive patterns on which a plurality of stopper layers are formed, respectively, on a substrate, the substrate including a first region having a first pattern density of the plurality of conductive patterns and a second region having a second pattern density of the plurality of conductive patterns, and the second pattern density being lower than the first pattern density; forming a first interlayer insulating layer on the plurality of conductive patterns; forming a photoresist pattern on the second region, the photoresist pattern exposing at least a portion of the first interlayer insulating layer on the first region; etching the first interlayer insulating layer on the first region using the photoresist pattern as an etch mask; performing first polishing to expose upper surfaces of first ones of the plurality of stopper layers on the first region; etching the first ones of the plurality of stopper layers on the first region; forming a second interlayer insulating layer on the plurality of conductive patterns; and performing second polishing to expose upper surfaces of first ones of the plurality of conductive patterns on the first region.

According to example embodiments, a method of manufacturing a semiconductor device includes forming a first conductive pattern on which a first stopper layer is formed and a second conductive pattern on which a second stopper layer is formed, on a substrate; forming a first interlayer insulating layer on the first conductive pattern and the second conductive pattern; exposing at least a portion of the first interlayer insulating layer formed on a first region of the substrate on which the first conductive pattern is present and forming a photoresist pattern on the first interlayer insulating layer formed on a second region of the substrate on which the second conductive pattern is present; etching the at least a portion of the first interlayer insulating layer on the first region of the substrate; performing first polishing to expose an upper surface of the first stopper layer; etching the first stopper layer; forming a second interlayer insulating layer on the first conductive pattern and the second conductive pattern; and performing second polishing to expose an upper surface of the first conductive pattern. A first pattern density of the first conductive pattern is greater than a pattern density of a surrounding area, and a second pattern density of the second conductive pattern is less than the first pattern density.

According to example embodiments, a method of manufacturing a semiconductor device includes forming a first conductive pattern on which a first stopper layer is formed and a second conductive pattern on which a second stopper layer is formed, on a lower insulating layer; forming a first interlayer insulating layer on the first conductive pattern and the second conductive pattern; exposing at least a portion of the first interlayer insulating layer on a first region of the lower insulating layer on which the first conductive pattern is present and forming a photoresist pattern on the first interlayer insulating layer on a second region of the lower insulating layer on which the second conductive pattern is present; etching the at least a portion of the first interlayer insulating layer on the first region of the lower insulating layer; performing first polishing to expose an upper surface of the first stopper layer; etching the first stopper layer; forming a second interlayer insulating layer on the first conductive pattern and the second conductive pattern; and performing second polishing to expose an upper surface of the first conductive pattern. A first pattern density of the first conductive pattern is greater than a pattern density of a surrounding area, and a second pattern density of the second conductive pattern is less than the first pattern density.

According to example embodiments, a semiconductor device includes a substrate including a first region having a first pattern density and a second region having a second pattern density less than the first pattern density; a plurality of conductive patterns including a first conductive pattern on the first region and a second conductive pattern on the second region; a stopper layer on the second conductive pattern; a first interlayer insulating layer on the second region and extending on (e.g., covering) at least a portion of the second conductive pattern; and a second interlayer insulating layer on the first region and the second region and in spaces between the plurality of conductive patterns. The second conductive pattern is an align key and/or an overlay pattern.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
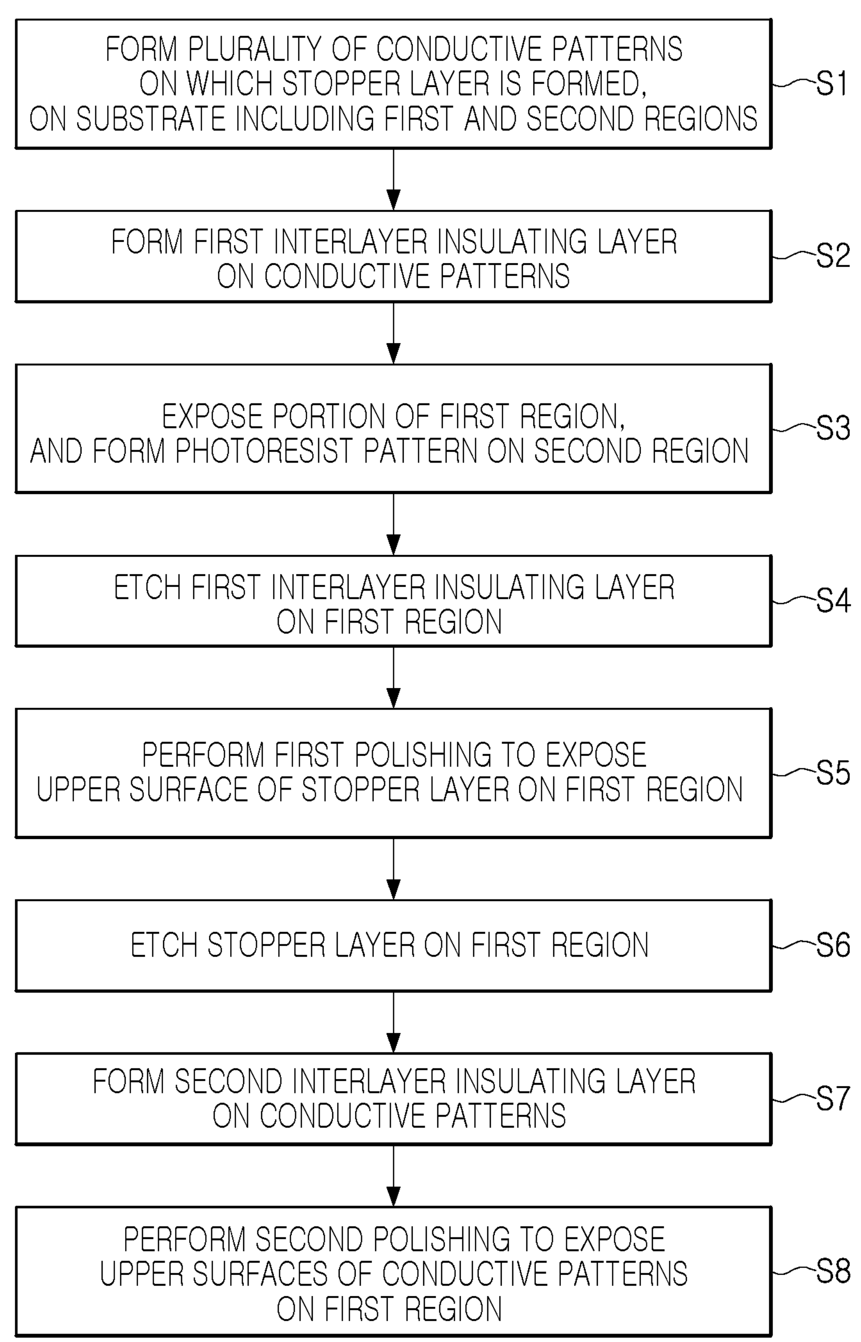
FIG. 1 is a flowchart of a method of manufacturing a semiconductor device according to example embodiments.

FIG. 1 is a flowchart of a method of manufacturing a semiconductor device according to example embodiments.

Figure 4:
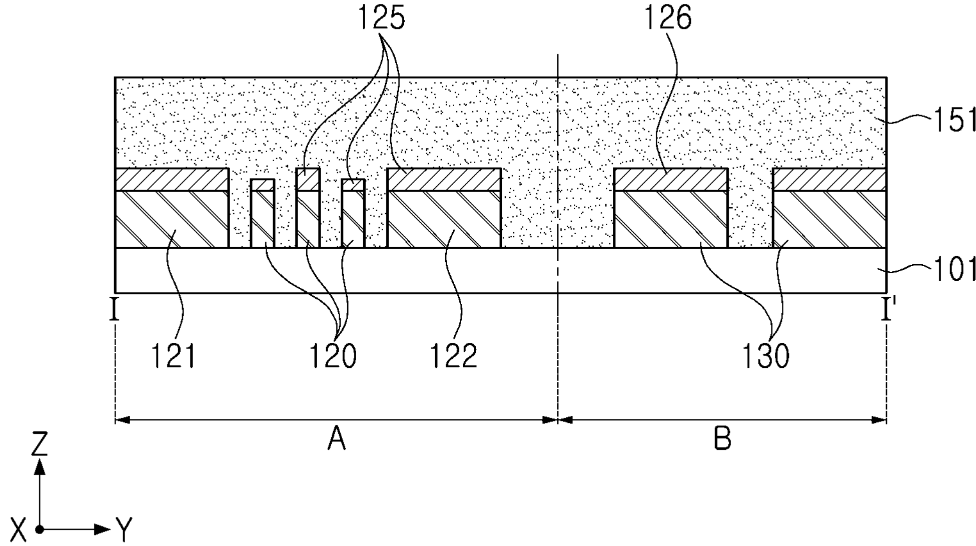
FIGS. 4, 5, 6, and 8 are cross-sectional views illustrating a method of manufacturing a semiconductor device according to example embodiments.

Referring to FIG. 1, a method of manufacturing a semiconductor device according to example embodiments may start with forming a plurality of conductive patterns (e.g., conductive patterns 120, 121, 122, and 130 in FIG. 4) on which a first stopper layer and a second stopper layer (e.g., a first stopper layer 125 and a second stopper layer 126 in FIG. 4) are formed, on a substrate (e.g., a substrate in FIG. 4) 101 (Block S1).

Next, a first interlayer insulating layer (e.g., a first interlayer insulating layer 151 in FIG. 4) may be formed on the plurality of conductive patterns. For example, the first interlayer insulating layer may be formed to cover the plurality of conductive patterns, the first stopper layer, and the second stopper layer (Block S2).

Then, the first interlayer insulating layer on a first region (e.g., a first region A in FIG. 5) on which the first conductive patterns are present may be exposed, and a photoresist pattern (e.g., a photoresist pattern 200 in FIG. 5) may be formed to cover the first interlayer insulating layer on a second region (e.g., a second region B in FIG. 5) on which the second conductive patterns are present (Block S3). For example, at least a portion of the first interlayer insulating layer on the first region may be exposed, and the photoresist pattern disposed on the second region B may be formed (Block S3).

After forming the photoresist pattern, at least a portion of the exposed first interlayer insulating layer on the first region may be etched (Block S4).

Next, after removing the photoresist pattern, a first polishing operation may be performed to expose the upper surface of the first stopper layer using, for example, a chemical mechanical polishing (CMP) process (Block S5).

Next, an etch-back process may be performed to etch the first stopper layer, the upper surface of which is exposed on the first region (Block S6).

After removing the first stopper layer by etching, a second interlayer insulating layer (e.g., a second interlayer insulating layer 152 in FIG. 8) may be formed to cover the plurality of conductive patterns and the second stopper layer. (Block S7).

Next, a second polishing operation may be performed on the second interlayer insulating layer using a chemical mechanical polishing (CMP) process to expose the upper surfaces of the first conductive patterns and the upper surface of the second stopper layer (Block S8). Since the second stopper layer remains even after the upper surfaces of the first conductive patterns are exposed, the second stopper layer may protect the second conductive patterns. As a result, in a subsequent process, the second conductive patterns may serve as an align key and/or an overlay pattern, thereby providing a semiconductor device having improved integration and/or electrical characteristics.

Figure 2:
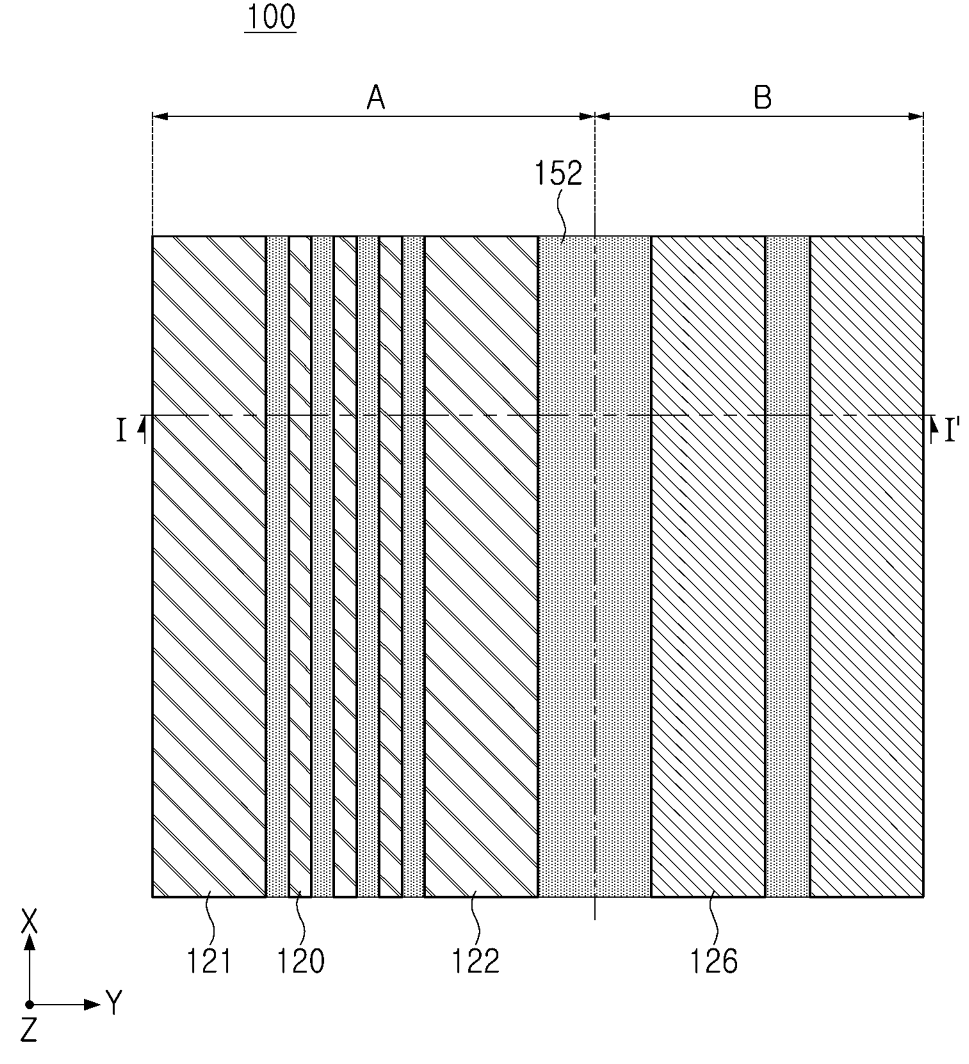
FIG. 2 is a plan view of a semiconductor device according to example embodiments.

FIG. 2 is a plan view of a semiconductor device according to example embodiments.

Figure 3:
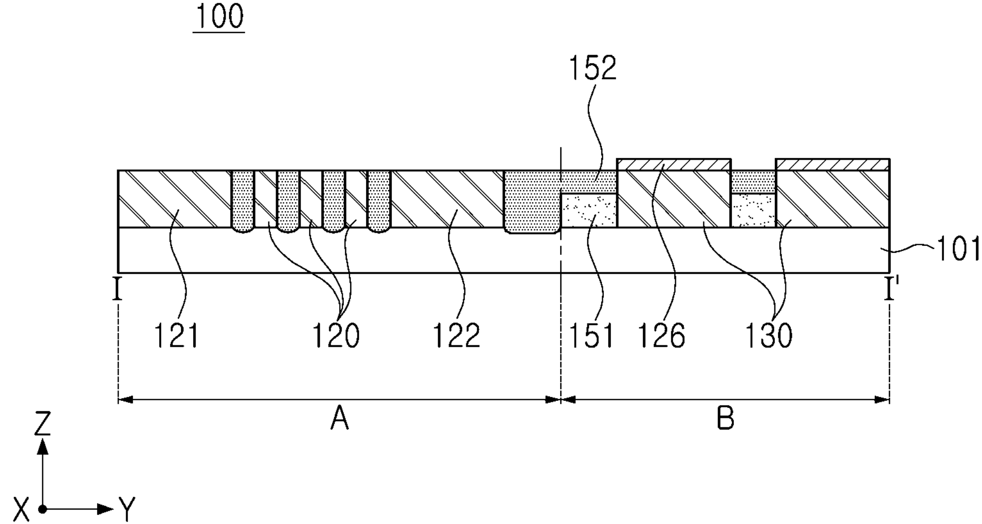
FIG. 3 is a cross-sectional view of a semiconductor device according to example embodiments.

FIG. 3 is a cross-sectional view of a semiconductor device according to example embodiments.

FIG. 3 illustrates a cross-section of the semiconductor device of FIG. 2 taken along the line I-I'.

For convenience of explanation, in FIGS. 2 and 3, only the main components of a semiconductor device 100 are illustrated, and as a substrate 101, only a portion of a substrate (e.g., a semiconductor wafer) is illustrated.

Referring to FIGS. 2 and 3, the semiconductor device 100 may include a substrate 101, first conductive patterns 120, 121, and 122 and a second conductive pattern 130 on which a second stopper layer 126 is formed, on the substrate 101, a first interlayer insulating layer 151, and a second interlayer insulating layer 152.

As in FIG. 2, a portion marked 'A' may be referred to as a first region A, and a portion marked 'B' may be referred to as a second region B. The first region A corresponds to a region in which the pattern density is relatively greater than a density of the surrounding area and may have a first pattern density. The second region B corresponds to a region in which the pattern density is relatively lower than a density of the surrounding area and may have a second pattern density lower than the first pattern density. According to example embodiments, the first region A may correspond to a cell region, and the second region B may correspond to a peripheral region. Since complex semiconductor devices are formed in the first region A, the first region A may be a region in which the pattern density may be significantly high, and the second region B may be a region in which an align key and/or an overlay pattern for a photolithography process is formed and may be a region in which the pattern density is significantly low.

The substrate 101 may include a first region A having a first pattern density and a second region B having a second pattern density less than the first pattern density. The substrate 101 may have an upper surface extending in the first direction (X) and the second direction (Y). The substrate 101 may be a multilayer substrate such as a semiconductor substrate or a silicon on insulator (SOI). The semiconductor substrate may include, for example, silicon (Si), germanium (Ge), silicon germanium (SiGe), silicon carbide (SiC), gallium nitride (GaN), or gallium arsenide (GaAs). The substrate 101 is a semiconductor substrate doped with impurities to be p-type or n-type and may include an active region in which devices such as transistors are formed. The substrate 101 may include a semiconductor material, such as a Group IV semiconductor, a Group III-V compound semiconductor, or a Group II-VI compound semiconductor. The substrate 101 may be provided as a bulk wafer or an epitaxial layer.

A base layer formed of various conductive layers or insulating layers constituting a semiconductor device may be interposed between the substrate 101 and the plurality of conductive patterns 120, 121, 122, and 130. The insulating layers may be disposed on the surface of the substrate 101 on which the active region is formed. The insulating layers may be provided as regions for forming wiring lines such as BEOL, but are not limited thereto. A wiring line to be formed on the insulating layers in a subsequent process may be electrically connected to the active region through a contact structure (not illustrated). The insulating layers may include, for example, tetraethyl ortho silicate (TEOS), silicon oxide ($SiO_2$), silicon oxynitride (SiON), nanoporous silica, hydrogensilsesquioxanes (HSQ), polytetrafluorethylene or PTFE (Teflon-AF), silicon oxyfluoride (FSG), carbon doped $SiO_2$ (SiCO), hydrogenated silicon oxycarbide (SiCOH), or low-k or ultra-low-k (ULK) dielectric materials (e.g., a dielectric constant of 2.5 or less). Hereinafter, formation of the plurality of conductive patterns 120, 121, 122, and 130 directly on the substrate 101 will be described as an example.

The plurality of conductive patterns 120, 121, 122, and 130 may include the first conductive patterns 120, 121, and 122 on the first region A and the second conductive patterns 130 on the second region B. The first conductive patterns 120, 121, and 122 may include a first power distribution pattern 121, a second power distribution pattern 122, and wiring patterns 120 arranged in the second direction (Y).

The first and second power distribution patterns 121 and 122 may extend in a first direction (X) crossing the second direction (Y). According to example embodiments, the first power distribution pattern 121 may supply first power VDD to the cells, and the second power distribution pattern 122 may supply second power VSS lower than the first power VDD to the cells. The wiring patterns 120 are disposed at the same level as the first and second power distribution patterns 121 and 122 and may extend in the first direction (X) intersecting the second direction (Y). The first conductive patterns 120, 121, and 122 may include a conductive material. For example, the first conductive patterns 120, 121, and 122 may include a noble metal. Specifically, the first conductive pattern may include ruthenium (Ru), rhodium (Rh), palladium (Pd), silver (Ag), iridium (Ir), platinum (Pt), gold (Au), or the like.

The second conductive patterns 130 may be arranged in the second direction (Y). The second conductive pattern 130 may be an align key and/or an overlay pattern. The second conductive pattern 130 may include substantially the same material as a material of the first conductive patterns 120, 121, and 122, but is not limited thereto. Since a width of the wiring patterns 120 is narrower than a width of the second conductive pattern 130, the number of wiring patterns 120 present in the first region A may be greater than the number of second conductive patterns 130 present in the second region B. Therefore, the first region A may have a higher pattern density than the second region B. A pattern density of the first region A may be a pattern density of the first conductive patterns 120, 121, and 122, and a pattern density of the second region B may be a pattern density of the second conductive pattern 130.

The stopper layers 125 and 126 may include a first stopper layer 125 and a second stopper layer 126. The first stopper layer 125 may be disposed on the first conductive patterns 120, 121, and 122. The second stopper layer 126 may be disposed on the second conductive pattern 130. The second stopper layer 126 may reduce or prevent the damage to the second conductive pattern 130 on the second region B and may protect the second conductive pattern 130 serving as an align key and/or an overlay pattern in a subsequent process. The second stopper layer 126 may be formed of, for example, oxide, nitride, and oxynitride, and in detail, may include at least one of SiO, SiN, SiCN, SiOC, SiON, and SiOCN.

The first interlayer insulating layer 151 may be present on the second region B. The first interlayer insulating layer 151 may cover the upper surface of the substrate 101. The first interlayer insulating layer 151 may be disposed between the second conductive patterns 130. An upper surface of the first interlayer insulating layer 151 may be located at a level lower than an upper surface of the second conductive patterns 130. The first interlayer insulating layer 151 may include at least one of, for example, oxide, nitride, oxynitride, and low-k dielectric. In some embodiments, the low-k dielectric may be formed of SiOC, SiO, SiOF or SiCOH. As used herein, "a surface A is lower than a surface B" (or similar language) means that the surface A is closer than the surface B to the substrate 101.

The second interlayer insulating layer 152 may be disposed on the first region A and the second region B. The second interlayer insulating layer 152 may be disposed between the first and second conductive patterns 120, 121, 122, and 130. The second interlayer insulating layer 152 may cover the substrate 101 and the first interlayer insulating layer 151. An upper surface of the second interlayer insulating layer 152 may be substantially coplanar with upper surfaces of the first and second conductive patterns 120, 121, 122, and 130. According to some embodiments, an upper surface of the second stopper layer 126 may be located at a higher level than an upper surface of the second interlayer insulating layer 152. The second interlayer insulating layer 152 may extend into (e.g., pass through) a portion of the substrate 101. The second interlayer insulating layer 152 may be, for example, an oxide layer. The second interlayer insulating layer 152 may include substantially the same material as a material of the first interlayer insulating layer 151, but is not limited thereto.

FIGS. 4 to 8 are cross-sectional views illustrating a method of manufacturing a semiconductor device according to example embodiments. FIGS. 4 to 8 illustrate cross-sections of the semiconductor device of FIG. 2 taken along the line I-I'.

Referring to FIGS. 1 and 4, after forming the first conductive patterns 120, 121, 122 on the first region A and the second conductive pattern 130 on the second region B (Block S1), a first interlayer insulating layer 151 may be formed (Block S2).

First, the first conductive patterns 1201, 121, and 122 on the first region A and the second conductive pattern 130 on the second region B may be formed (Block S1). The interval between the first and second power distribution patterns 121 and 122 and the wiring patterns 120 disposed on the first region A may be less than the interval between the second conductive patterns 130 disposed on the second region B. After forming the first conductive patterns 120, 121, and 122 and the second conductive pattern 130, the first stopper layer 125 on the first conductive patterns 120, 121, and 122 and the second stopper layer 126 on the second conductive pattern 130 may be formed. According to some embodiments, in the first region A, in which the pattern density is relatively high, the upper surface of the first stopper layer 125 on the wiring patterns 120 may be disposed at a level lower than the upper surface of the first stopper layer 126 on the first and second power distribution patterns 121 and 122. In addition, the upper surface of the first stopper layer 125 on the wiring patterns 120 may be disposed at a lower level than the upper surface of the second stopper layer 126 on the second conductive pattern 130, but the present disclosure is not limited thereto.

Next, a first interlayer layer 151 may be formed to cover the substrate 101, the first conductive patterns 120, 121, and 122, the second conductive pattern 130, the first stopper layer 125, and the second stopper layer 126. As illustrated in FIG. 4, the upper surface of the first interlayer insulating layer 151 is illustrated as having substantially the same level on the first region A and the second region B, but the present disclosure is not limited thereto. For example, the upper surface of the first interlayer insulating layer 151 on the first region A having a relatively high pattern density may be located at a level higher than the upper surface of the first interlayer insulating layer 151 on the second region B.

Figure 5:
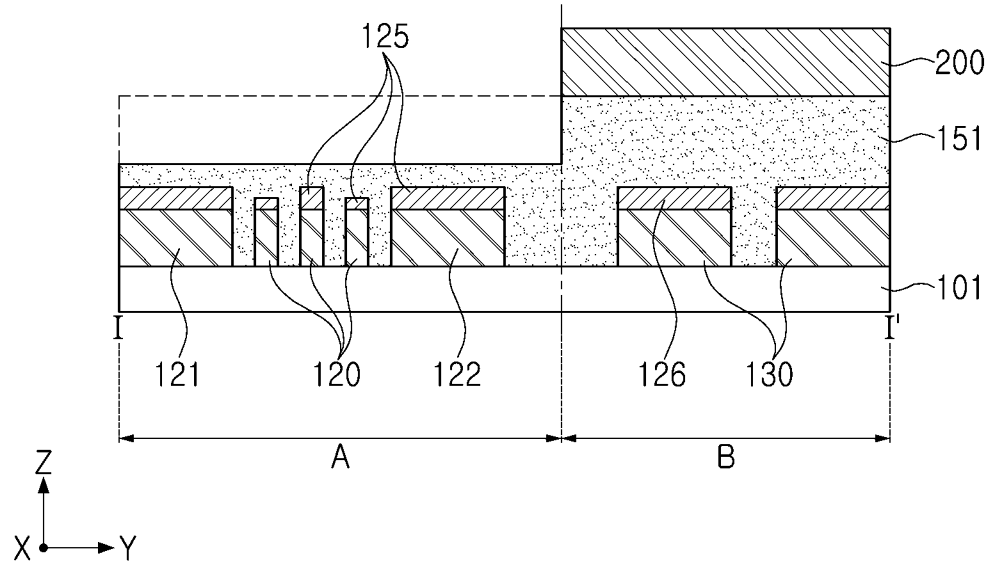

Referring to FIGS. 1 and 5, the first interlayer insulating layer 151 on the first region A may be exposed and the photoresist pattern 200 disposed on the first interlayer insulating layer 151 on the second region B may be formed (Block S3). Next, at least a portion of the first interlayer insulating layer 151 on the first region A may be etched using the photoresist pattern 200 as an etch mask (Block S4).

In a case in which a subsequent chemical mechanical polishing (CMP) process is performed without forming the photoresist pattern 200, since more chemical mechanical polishing (CMP) occurs in the second region B having a relatively lower pattern density than in the first region A having a high pattern density, dishing occurs. In the second region B in which dishing has occurred, the second stopper layer 126 is exposed while chemical mechanical polishing (CMP) continues, and if the chemical mechanical polishing (CMP) process is excessive, the second stopper layer 126 on the second region B is polished to become thin or removed, thereby causing damage applied to the second conductive pattern 130 on the second region B. Thus, in a subsequent process, the second conductive pattern 130 may not function properly as an align key and/or an overlay pattern. Therefore, the first region A having a high pattern density is exposed, the photoresist pattern 200 is formed on the second region B having a low pattern density, and the photoresist pattern 200 is used to form a step in the first interlayer insulating layer 151 on the first region A and the second region B, thereby reducing/preventing the above problem.

Specifically, at least a portion of the first interlayer insulating layer 151 in the first region A may be etched using the photoresist pattern 200 (Block S4). The first interlayer insulating layer 151 may be formed of a material having etch selectivity with respect to the photoresist pattern 200. In addition, the process of etching at least a portion of the first interlayer insulating layer 151 on the first region A may be performed through, for example, a dry etching process and/or a wet etching process. After etching at least a portion of the first interlayer insulating layer 151 on the first region A (Block S4), the upper surface of the first interlayer insulating layer 151 on the second region B may be located at a level higher than the upper surface of the first interlayer insulating layer 151 on the first region A. For example, the upper surface of the first interlayer insulating layer 151 on the second region B may be located at a level about 500 Å to about 1500 Å higher than the upper surface of the first interlayer insulating layer 151 on the first region A. Specifically, the upper surface of the first interlayer insulating layer 151 on the second region B may be located at a level about 500 Å to about 1000 Å higher than the upper surface of the first interlayer insulating layer 151 on the first region A. In the example embodiment, it was measured that the upper surface of the first interlayer insulating layer 151 on the second region B was located at a level about 700 Å higher than the upper surface of the first interlayer insulating layer 151 on the first region A. If the level difference between the upper surface of the first interlayer insulating layer 151 on the second region B and the upper surface of the first interlayer insulating layer 151 on the first region A is less than about 500 Å, in a subsequent process, the second stopper layer 126 is removed and the second conductive pattern 130 may be damaged. If the level difference between the upper surface of the first interlayer insulating layer 151 on the second region B and the upper surface of the first interlayer insulating layer 151 on the first region A is greater than about 1500 Å, the first conductive patterns 120, 121 and 122 may be damaged, and electrical characteristics of the semiconductor device may be reduced or deteriorated.

Figure 6:
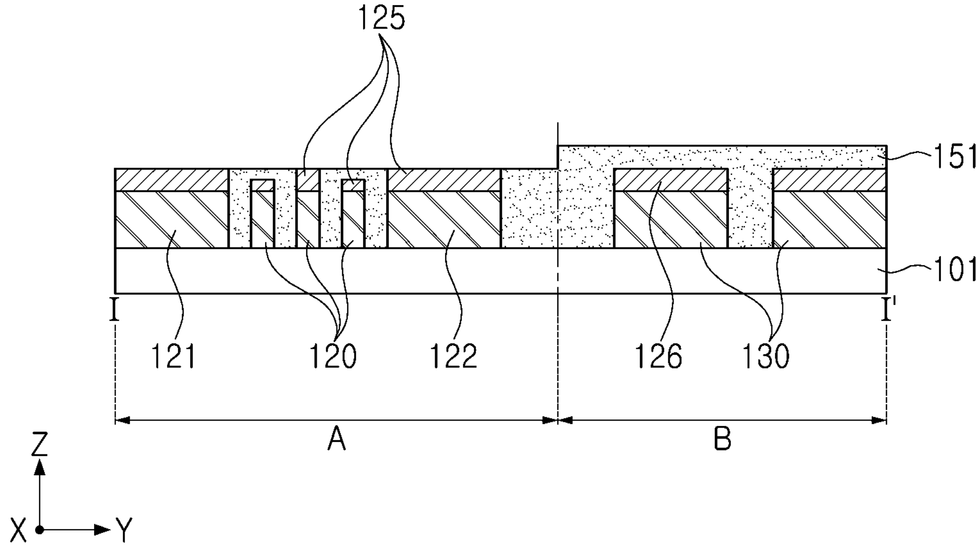

Referring to FIGS. 1 and 6, after removing the photoresist pattern 200, a first polishing process (e.g., a chemical mechanical polishing (CMP) process) to expose the upper surface of the first stopper layer 125 may be performed (Block S5).

While the first polishing process is in progress, the level of the upper surface of the first interlayer insulating layer 151 on the first region A and the second region B may be lowered. After the first polishing process is performed, the upper surface of the first interlayer insulating layer 151 on the first region A may be located at a lower level than the upper surface of the first interlayer insulating layer 151 on the second region B. For example, the upper surface of the first interlayer insulating layer 151 on the second region B may be located at a higher level than the upper surface of the first interlayer insulating layer 151 on the first region A. Therefore, in the subsequent process of removing the first stopper layer 125, the first interlayer insulating layer 151 on the second region B may partially protect the second stopper layer 126.

Figure 7:
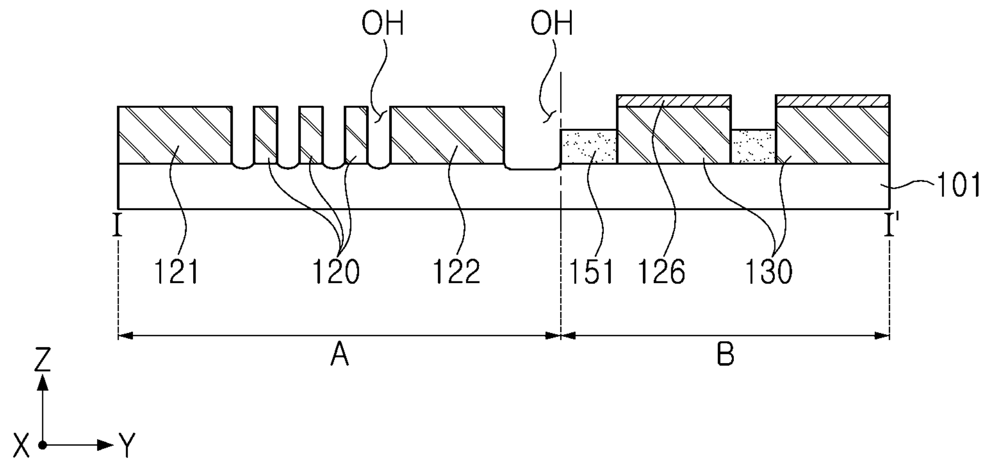

Referring to FIGS. 1 and 7, the first stopper layer 125 may be removed by etching (Block S6).

The first stopper layer 125 may be removed by an etch-back process. Etching the first stopper layer 125 on the first region A may include etching the upper surfaces of the first conductive patterns 120, 121, and 122 to be exposed. Also, the etching of the first stopper layer 125 may include etching portions of the first interlayer insulating layer 151 and the second stopper layer 126. For example, in the process of removing the first stopper layer 125, portions of the first interlayer insulating layer 151 and the second stopper layer 126 may be removed. Also, a portion of the substrate 101 may be removed, but is not limited thereto. Due to the process of removing the first stopper layer 125, openings OH may be formed between the first conductive patterns 120, 121, and 122 and between the second conductive patterns 130. In the operation before removing the first stopper layer 125, the upper surface of the first interlayer insulating layer 151 on the second region B may be located at a higher level than the upper surface of the first interlayer insulating layer 151 on the first region A. In addition, the first stopper layer 125 and the second stopper layer 126 and the first interlayer insulating layer 151 may have etching selectivity to each other, and the first stopper layer 125 and the second stopper layer 126 and the second interlayer insulating layer 152 may have etch selectivity to each other. Therefore, after removing the first stopper layer 125, the first interlayer insulating layer 151 and the second stopper layer 126 on the second region B may remain.

Figure 8:
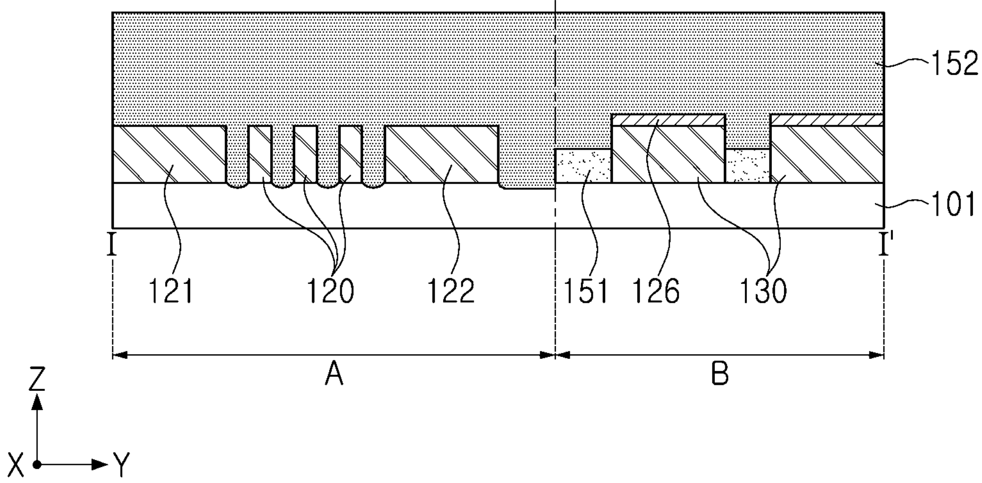

Referring to FIGS. 1 and 8, the second interlayer insulating layer 152 may be formed on the first conductive patterns 120, 121, and 122 and the second conductive pattern 130 to fill the openings OH (Block S7).

The upper surfaces of the second interlayer insulating layer 152 on the first region A and the second region B may be coplanar, but the present disclosure is not limited thereto. The second interlayer insulating layer 152 may contact the upper surfaces of the first conductive patterns 120, 121, and 122, the upper surface of the substrate 101, the upper surface of the first interlayer insulating layer 151, and the second stopper layer 126.

Next, referring to FIGS. 1 and 3, a second polishing process (e.g., a chemical mechanical polishing (CMP) process) may be performed to expose the upper surfaces of the first conductive patterns 120, 121, and 122 (Block S8).

While the second polishing process is in progress, the second stopper layer 126 may protect the second conductive pattern 130. For this reason, when a subsequent process is performed, the second conductive pattern 130 may serve as an align key and/or an overlay pattern. After the second polishing process is performed, the upper surfaces of the first conductive patterns 120, 121, and 122 and the upper surface of the second interlayer insulating layer 152 may form a coplanar surface, but is not limited thereto. After the second polishing process is performed, the second stopper layer 126 may remain. Thus, after the second polishing operation, the upper surface of the second stopper layer 126 may be located at a higher level than the upper surface of the first conductive patterns 120, 121, and 122.

Figure 9:
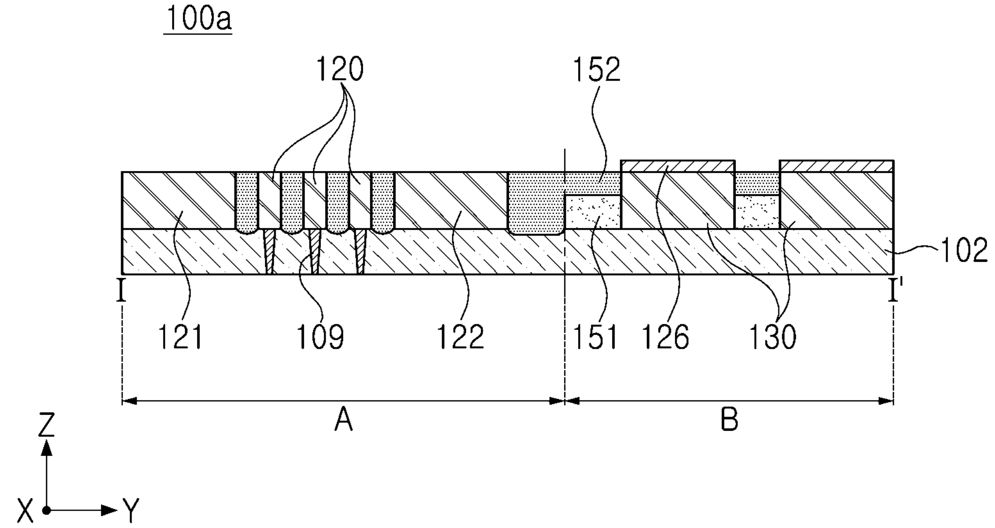
FIG. 9 is a cross-sectional view of a semiconductor device according to example embodiments.

FIG. 9 is a cross-sectional view illustrating a semiconductor device according to example embodiments. FIG. 9 illustrates a cross section of the semiconductor device of FIG. 2 taken along a cutting line I-I' according to some other embodiments. In the following description, a description overlapping with the above description provided with reference to FIGS. 1 to 3 will be omitted.

Referring to FIG. 9, a semiconductor device 100*a* may include a lower insulating layer 102, first conductive patterns 120, 121 and 122 and a second conductive pattern 130 on which a second stopper layer 126 is formed, on the lower insulating layer 102, a first interlayer insulating layer 151, and a second interlayer insulating layer 152. The semiconductor device 100*a* may further include a via 109.

The lower insulating layer 102 may include a first region A and a second region B. The lower insulating layer 102 may include substantially the same material as the first insulating interlayer 151 and the second insulating interlayer 152, but is not limited thereto. The lower insulating layer 102 may be disposed on the surface on which the active region of the substrate 101 is formed. The lower insulating layer 102 may have a front-end-of-line (FEOL) and/or middle-of-line (MOL) structure. The lower insulating layer 102 may include a low-k dielectric material and/or silicon oxide. For example, the low-k dielectric material may include Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or combinations thereof.

The via 109 may be formed in the lower insulating layer 102. The via 109 may pass through at least a portion of the lower insulating layer 102. The via 109 may contact at least one of the first conductive patterns 120, 121, and 122. For example, the vias 109 may contact the wiring patterns 120. The via 109 may have an inclined side surface in which a width of a lower part is less than a width of an upper part according to an aspect ratio. The via 109 may include a metal material, for example, at least one of aluminum (Al), copper (Cu), tungsten (W), cobalt (Co), ruthenium (Ru), and molybdenum (Mo), but the present disclosure is not limited thereto.

The semiconductor device 100*a* of FIG. 9 may be manufactured by a process similar to the process of the semiconductor device 100 of FIG. 3. First, the via 109 may be formed on the lower insulating layer 102. Next, the same process as the above-described FIGS. 3 to 8 may be performed. Next, referring to FIG. 9 together, a second polishing process of performing a chemical mechanical polishing (CMP) process may be performed to expose the upper surfaces of the first conductive patterns 120, 121, and 122 (Block S8). After the second polishing process is performed, the second stopper layer 126 may remain. Therefore, when a subsequent process is performed, the second conductive pattern 130 may serve as an align key and/or an overlay pattern. As a result, the semiconductor device 100*a* having improved integration and/or electrical characteristics may be provided.

As set forth above, according to some embodiments, a step may be formed in the first interlayer insulating layer by forming a photoresist pattern exposing a region having a relatively high pattern density, and a semiconductor device having improved integration and/or electrical characteristics and a method of manufacturing the same may be provided by a structure in which the stopper layer is present in a region having a relatively low pattern density.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concepts.

As used herein, an element or region that is "covering" or "surrounding" or "filling" another element or region may completely or partially cover or surround or fill the other element or region.

While example embodiments have been illustrated and described above, it will be apparent to those skilled in the art that modifications and variations could be made without departing from the scope of the present disclosure as defined by the appended claims.

What is claimed is:

1. A method of manufacturing a semiconductor device comprising:

forming a plurality of conductive patterns on which a plurality of stopper layers are formed, respectively, on a substrate, the substrate including a first region having a first pattern density of the plurality of conductive patterns and a second region having a second pattern density of the plurality of conductive patterns, and the second pattern density being lower than the first pattern density;

forming a first interlayer insulating layer on the plurality of conductive patterns;

forming a photoresist pattern on the second region, the photoresist pattern exposing at least a portion of the first interlayer insulating layer on the first region;

etching the first interlayer insulating layer on the first region using the photoresist pattern as an etch mask;

performing first polishing to expose upper surfaces of first ones of the plurality of stopper layers on the first region;

etching the first ones of the plurality of stopper layers on the first region;

forming a second interlayer insulating layer on the plurality of conductive patterns; and performing second polishing to expose upper surfaces of first ones of the plurality of conductive patterns on the first region.

2. The method of claim 1, wherein the first region is a cell region, and the second region is a peripheral region.

3. The method of claim 1, wherein after performing first polishing, the first interlayer insulating layer is on upper surfaces of second ones of the plurality of stopper layers on the second region.

4. The method of claim 1, wherein the photoresist pattern covers the first interlayer insulating layer on the second region.

5. The method of claim 1, wherein after etching the first ones of the plurality of stopper layers, respectively, on the first region, second ones of the plurality of stopper layers on the second region are present on second ones of the plurality of conductive patterns on the second region.

6. The method of claim 1, wherein after etching the first interlayer insulating layer on the first region, an upper surface of the first interlayer insulating layer on the second region is located at a level of about 500 Å to about 1500 Å higher than an upper surface of the first interlayer insulating layer on the first region.

7. The method of claim 1, wherein after performing first polishing, an upper surface of the first interlayer insulating layer on the first region is located at a lower level than an upper surface of the first interlayer insulating layer on the second region.

8. The method of claim 1, wherein etching the first ones of the plurality of stopper layers on the first region exposes the first ones of the plurality of conductive patterns on the first region.

9. The method of claim 1, wherein the plurality of stopper layers and the first interlayer insulating layer have etch selectivity to each other, and the plurality of stopper layers and the second interlayer insulating layer have etch selectivity to each other.

10. The method of claim 1, wherein after etching the first ones of the plurality of stopper layers on the first region, the first interlayer insulating layer on the second region is present.

11. The method of claim 1, wherein after performing second polishing, second ones of the plurality of stopper layers on the second region are present.

12. The method of claim 1, wherein the plurality of conductive patterns include a noble metal.

13. The method of claim 1, wherein after performing second polishing, upper surfaces of second ones of the plurality of stopper layers on the second region are located at a higher level than an upper surface of the first interlayer insulating layer on the second region.

14. A method of manufacturing a semiconductor device comprising:

forming a first conductive pattern on which a first stopper layer is formed and a second conductive pattern on which a second stopper layer is formed on a substrate;

forming a first interlayer insulating layer on the first conductive pattern and the second conductive pattern;

exposing at least a portion of the first interlayer insulating layer formed on a first region of the substrate on which the first conductive pattern is present and forming a photoresist pattern on the first interlayer insulating layer formed on a second region of the substrate on which the second conductive pattern is present;

etching the at least a portion of the first interlayer insulating layer on the first region of the substrate;

performing first polishing to expose an upper surface of the first stopper layer;

etching the first stopper layer;

forming a second interlayer insulating layer on the first conductive pattern and the second conductive pattern; and performing second polishing to expose an upper surface of the first conductive pattern, wherein a first pattern density of the first conductive pattern is greater than a second pattern density of the second conductive pattern.

15. The method of claim 14, wherein the second conductive pattern is an align key and/or an overlay pattern.

16. The method of claim 14, wherein after etching the at least a portion of the first interlayer insulating layer, an upper surface of the first interlayer insulating layer on the second region in is located at a higher level than an upper surface of the first interlayer insulating layer on the first region.

17. The method of claim 14, wherein etching the first stopper layer includes etching portions of the first interlayer insulating layer and the second stopper layer.

18. The method of claim 14, wherein after performing the second polishing, an upper surface of the second stopper layer is located at a higher level than the upper surface of the first conductive pattern.

19. A method of manufacturing a semiconductor device comprising:

forming a first conductive pattern on which a first stopper layer is formed and a second conductive pattern on which a second stopper layer is formed on a lower insulating layer;

forming a first interlayer insulating layer on the first conductive pattern and the second conductive pattern;

exposing at least a portion of the first interlayer insulating layer on a first region of the lower insulating layer on which the first conductive pattern is present and forming a photoresist pattern on the first interlayer insulating layer on a second region of the lower insulating layer on which the second conductive pattern is present;

etching the at least a portion of the first interlayer insulating layer on the first region;

performing first polishing to expose an upper surface of the first stopper layer;

etching the first stopper layer;

forming a second interlayer insulating layer on the first conductive pattern and the second conductive pattern; and performing second polishing to expose an upper surface of the first conductive pattern, wherein a first pattern density of the first conductive pattern is greater than a second pattern density of the second conductive pattern.

20. The method of claim 19, further comprising a via in the lower insulating layer, wherein the via contacts the first conductive pattern.

* * * * *